United States Patent
Kim et al.

(10) Patent No.: US 10,410,549 B1
(45) Date of Patent: Sep. 10, 2019

(54) DISPLAY DEVICE

(71) Applicant: LG ELECTRONICS INC., Seoul (KR)

(72) Inventors: Hoyoung Kim, Seoul (KR);
Kyeongdong Kim, Seoul (KR);
Byunghee Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/049,571

(22) Filed: Jul. 30, 2018

(30) Foreign Application Priority Data

Jun. 1, 2018 (KR) .................. 10-2018-0063203
Jul. 30, 2018 (KR) .................. 10-2018-0088874

(51) Int. Cl.
| | |
|---|---|
| *G06F 1/16* | (2006.01) |
| *H05K 5/00* | (2006.01) |
| *H05K 7/00* | (2006.01) |
| *G09F 11/02* | (2006.01) |
| *G09F 11/08* | (2006.01) |

(52) U.S. Cl.
CPC .............. *G09F 11/02* (2013.01); *G09F 11/08* (2013.01)

(58) Field of Classification Search
CPC .... G06F 1/1652; G06F 1/1633; G06F 1/1637; G09F 11/08; G09F 11/02; G09F 11/04; G09F 11/10
USPC .............. 361/679.01, 679.02, 679.21–679.3, 361/679.55, 679.56; 349/56–60
See application file for complete search history.

(56) References Cited

U.S. PATENT DOCUMENTS

| | | | |
|---|---|---|---|
| 7,310,050 B2 * | 12/2007 | Yeh ...................... | G06F 1/1624 340/815.4 |
| 9,823,697 B2 * | 11/2017 | Hsu ....................... | G06F 1/1618 |
| 2010/0177020 A1 * | 7/2010 | Bemelmans ........... | G09F 9/00 345/55 |
| 2010/0246113 A1 * | 9/2010 | Visser ................... | G06F 1/1601 361/679.3 |
| 2011/0132557 A1 * | 6/2011 | Kuroi .................... | G03B 21/58 160/368.1 |

(Continued)

FOREIGN PATENT DOCUMENTS

| | | | | |
|---|---|---|---|---|
| JP | 2011253029 | 12/2011 | | |
| JP | 2011253029 A | * 12/2011 | ............... | G09F 9/00 |

(Continued)

OTHER PUBLICATIONS

European Patent Office Application Serial No. 18196855.3, Search Report dated Jan. 28, 2019, 7 pages.

(Continued)

*Primary Examiner* — Anthony M Haughton
(74) *Attorney, Agent, or Firm* — Lee, Hong, Degerman, Kang & Waimey PC

(57) ABSTRACT

A display device includes: a housing; a roller rotatably disposed on the housing; a flexible display that is rolled around the roller or unrolled from the roller; a first arm connected to the flexible display; an arm supporter provided in the housing; an arm shaft rotatably supported to the arm supporter; a second arm coupled to the arm shaft and rotated together with the arm shaft to rotate the first arm; a rotation mechanism connected to the second arm to rotate the second arm about the arm shaft; and an angle sensor module connected to at least one of the arm shaft and the second arm.

20 Claims, 10 Drawing Sheets

(56) References Cited

U.S. PATENT DOCUMENTS

| | | | |
|---|---|---|---|
| 2012/0002357 A1 | 1/2012 | Auld et al. | |
| 2015/0153777 A1* | 6/2015 | Liu | G06F 1/1652 |
| | | | 345/173 |
| 2017/0103735 A1* | 4/2017 | Oh | G06F 1/1626 |
| 2017/0325343 A1* | 11/2017 | Seo | H01L 51/0097 |
| 2018/0070467 A1 | 3/2018 | Kim et al. | |
| 2018/0077808 A1* | 3/2018 | Seo | G06F 3/044 |
| 2018/0114471 A1* | 4/2018 | Park | G09F 9/301 |
| 2018/0160554 A1* | 6/2018 | Kang | B21B 39/008 |
| 2018/0259451 A1* | 9/2018 | Buijs | H01F 27/2876 |

FOREIGN PATENT DOCUMENTS

| | | | | |
|---|---|---|---|---|
| JP | 2012508402 A * | 1/2012 | | G09F 9/30 |
| JP | 2012508402 | 4/2012 | | |
| KR | 20160022434 A * | 3/2016 | | G06F 1/1652 |
| KR | 20160150253 A * | 12/2016 | | G09F 9/301 |
| KR | 20170062343 A * | 6/2017 | | G02F 1/1333 |
| KR | 20180027318 A * | 3/2018 | | B21B 39/008 |
| KR | 20180045980 A * | 5/2018 | | G09F 9/301 |
| WO | 2006038171 | 4/2006 | | |
| WO | 2016093502 | 6/2016 | | |

OTHER PUBLICATIONS

Korean Intellectual Property Office Application No. 10-2018-0088874, Notice of Allowance dated Jul. 15, 2019, 2 pages.

* cited by examiner

DISPLAY DEVICE

CROSS-REFERENCE TO RELATED APPLICATIONS

Pursuant to 35 U.S.C. § 119(a), this application claims the benefit of earlier filing date and right of priority to Korean Patent Application Nos. 10-2018-0063203, filed on Jun. 1, 2018 and 10-2018-0088874, filed on Jul. 30, 2018, the contents of which are all hereby incorporated by reference herein in their entirety.

TECHNICAL FIELD

The present invention relates to a display device.

BACKGROUND

As the information society develops, the demand for display devices is increasing in various forms. In recent years, various display devices such as liquid crystal display device (LCD), plasma display panel (PDP), electro luminescent display (ELD), and vacuum fluorescent display (VFD) have been studied and used.

A display device using an organic light emitting diode (OLED) is superior to a liquid crystal display device in terms of luminance characteristics and viewing angle characteristics, and does not require a backlight unit, thereby realizing an ultra-thin display device.

The flexible display may be bent or rolled around the roller. A flexible display may be used to implement a display device that is unfoldable or rollable around a roller as needed. At this time, there is a problem that the flexible display is stably rolled around or unrolled from the roller.

SUMMARY

Embodiments provide a display device capable of sensing the height of a flexible display with high reliability and high accuracy.

A display device according to an embodiment of the present invention includes: a housing; a roller disposed in the housing; a flexible display configured to be rolled around the roller; an upper assembly coupled to an upper portion of the flexible display; a lift assembly comprising: a motor; a first arm coupled to the upper assembly; a second arm coupled to the first arm and configured to be pivotably raised in response to operation of the motor; a main gear configured to rotate in response to pivoting of the second arm; a driven gear engaged with the main gear; and a first sensor configured to detect an angle of the second arm based on a rotation of the driven gear, wherein the detected angle of the second arm based on the rotation of the driven gear is used to determine a vertical position of the upper assembly.

Wherein the lift assembly further comprises a biasing member configured to apply a biasing force to the upper assembly in a first direction for extending the flexible display away from the housing.

The display device further comprises a first magnetic member configured to magnetically engage the biasing member with the upper assembly.

Wherein the first magnetic member is disposed at a top surface of the biasing member.

Wherein the first magnetic member is disposed at the upper assembly.

Wherein the lift assembly further comprises a second magnetic member disposed at a stationary member and configured to magnetically engage with the upper assembly when the upper assembly contacts the stationary member.

Wherein the lift assembly further comprises a second magnetic member configured to magnetically engage with the upper assembly when the upper assembly is in a retracted position.

Wherein the stationary member comprises: a horizontal surface configured to contact a lower surface of the upper assembly; and a vertical member extending adjacent to the horizontal surface to prevent lateral movement of the upper assembly, wherein the second magnetic member is disposed at the horizontal surface.

Wherein as the upper assembly is moved to a retracted position, the upper assembly contacts the biasing member and thereafter contacts the stationary member.

Wherein the upper assembly is configured to move the biasing member in a second direction opposite the first direction as the upper assembly is moved to a retracted position; and the display further comprises a second sensor configured to detect a position of the biasing member, wherein the detected position of the biasing member is used with the detected angle of the second arm to determine the vertical position of the upper assembly.

The display device of claim 1, further comprises a controller configured to determine the vertical position based on the detected angle.

According to an embodiment of the present invention, the height of the flexible display may be reliably sensed, and the height of the flexible display may be controlled with higher accuracy.

In addition, the number of sensing values may be increased by the gear ratio of the main gear and the driven gear, and the rotation angle of the arm shaft and the second arm may be sensed with higher accuracy.

In addition, even when an external force is applied to the flexible display and thus the height of the flexible display is changed, the height of the flexible display may be calculated with high reliability.

Furthermore, it is possible to minimize the impact or noise which may occur when the flexible display is lowered.

Moreover, the flexible display may be reliably lowered to the maximum lowering height.

The details of one or more embodiments are set forth in the accompanying drawings and the description below. Other features will be apparent from the description and drawings, and from the claims.

DETAILED DESCRIPTION OF THE EMBODIMENTS

Hereinafter, specific embodiments of the present invention will be described in detail with reference to the accompanying drawings.

Figure 1:
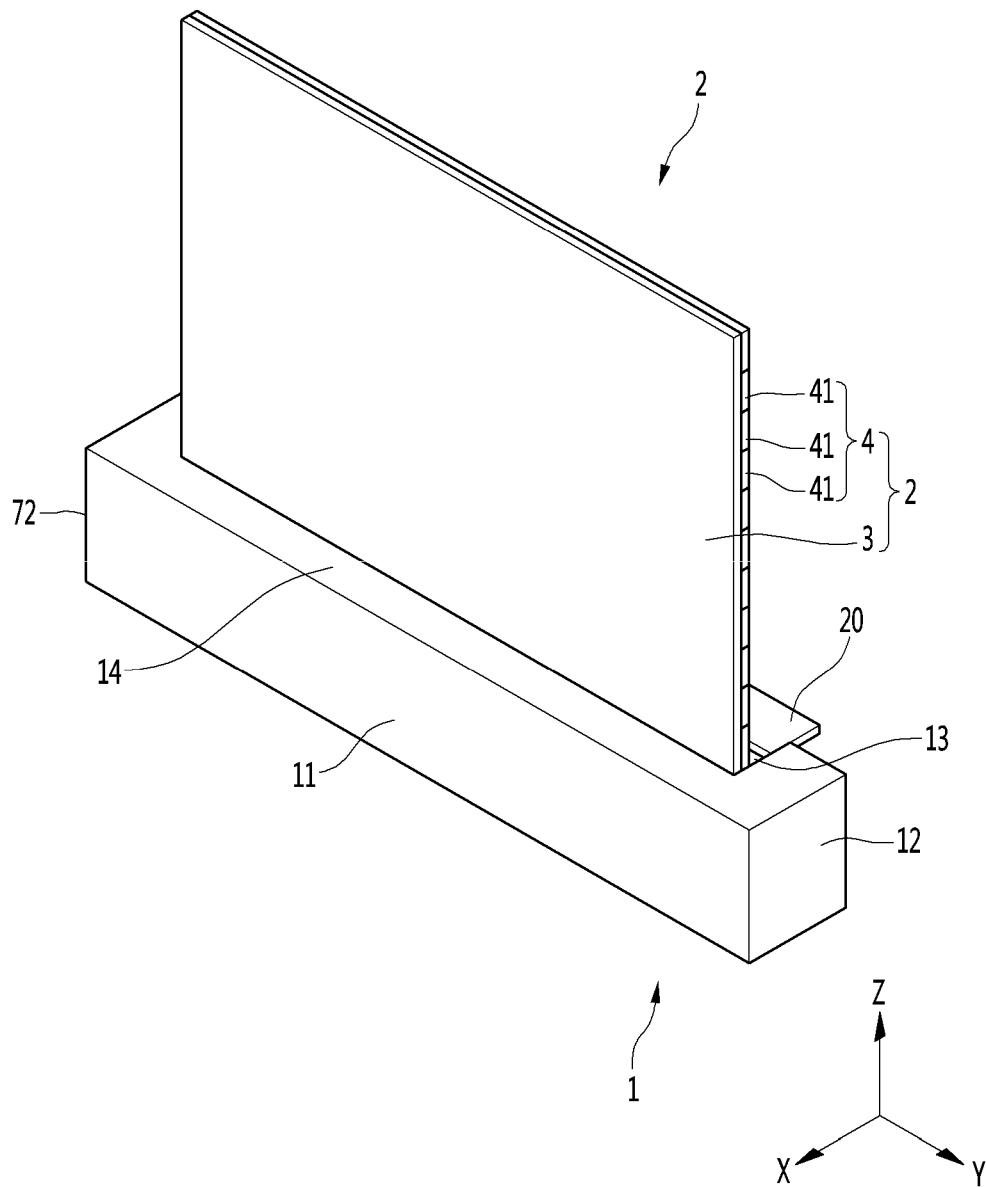
FIG. 1 is a perspective view of a display device according to an embodiment of the present invention.
Figure 2:
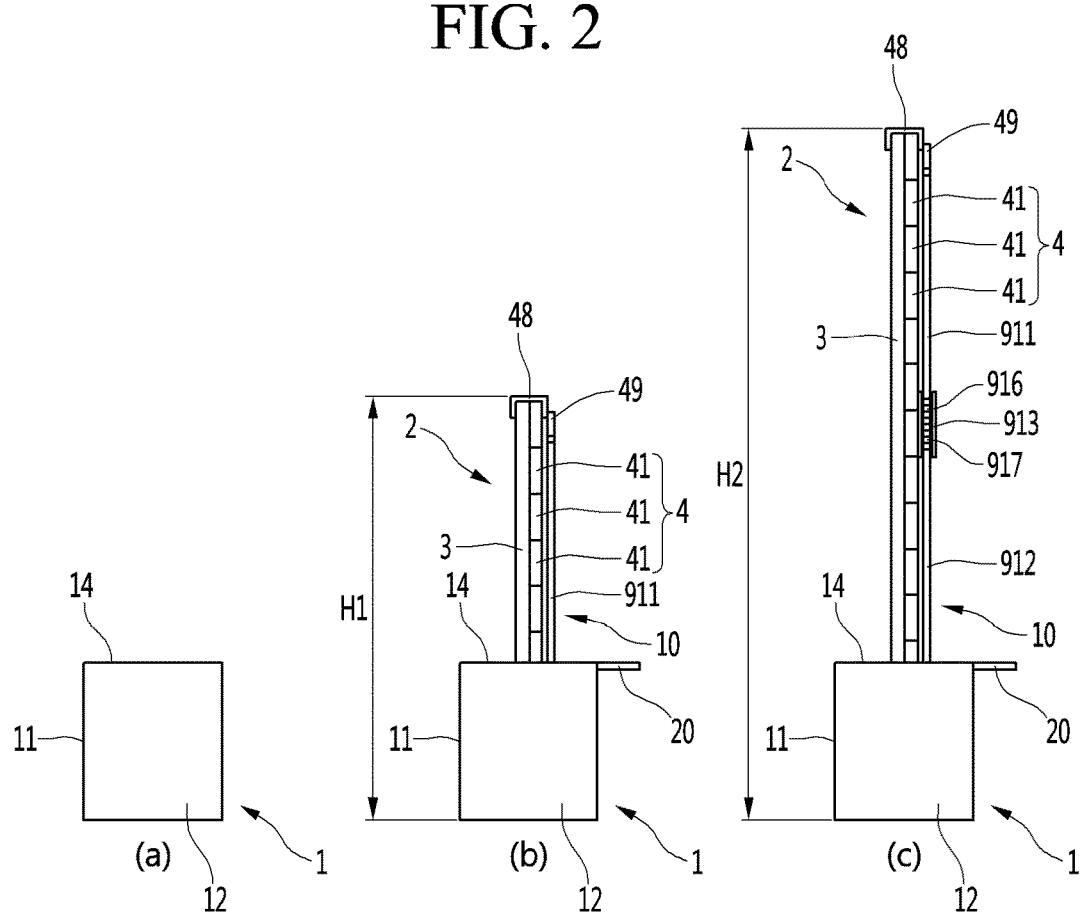
FIG. 2 is a side view illustrating operation examples of the display device according to an embodiment of the present invention.
Figure 3:
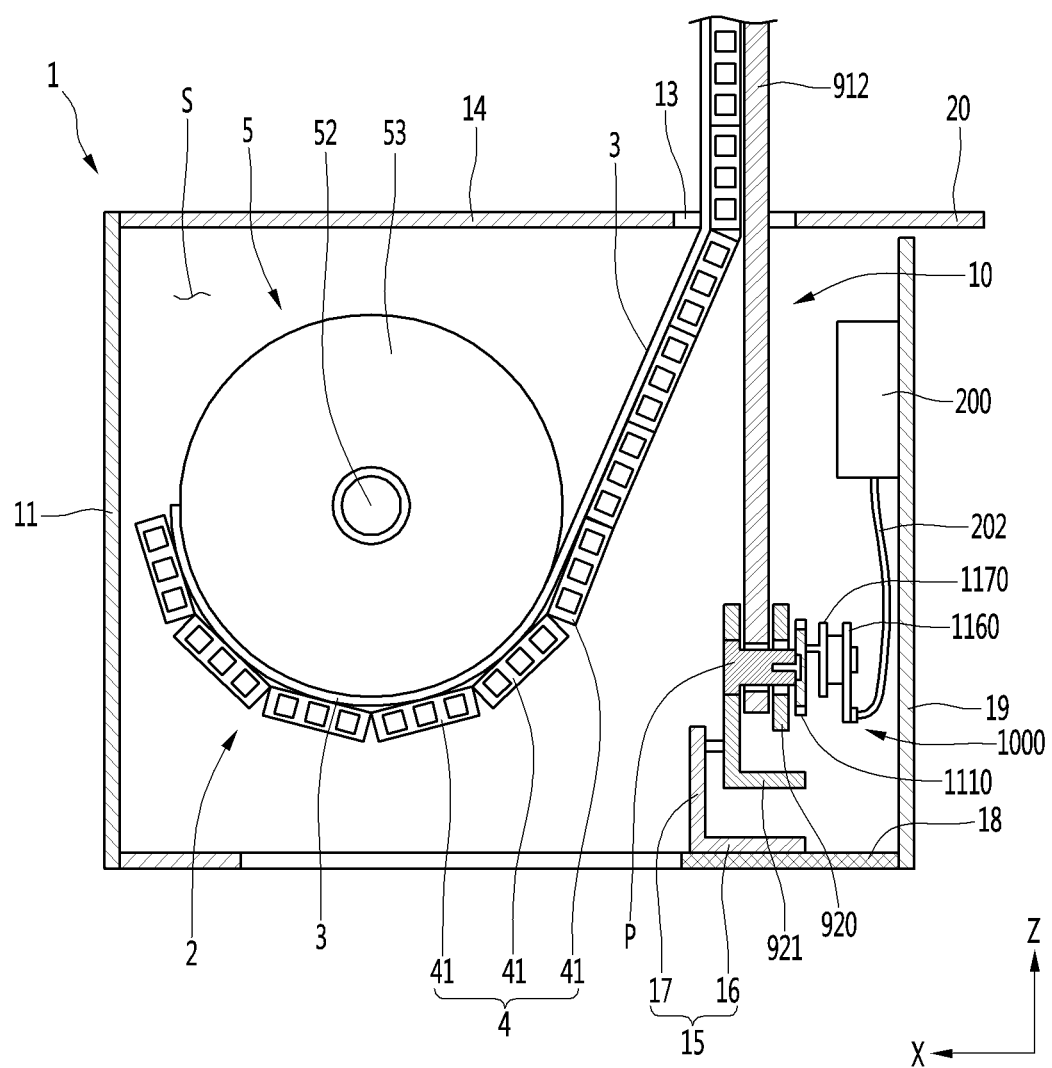
FIG. 3 is a cross-sectional view illustrating the inside of a housing in FIGS. 1 and 2.

FIG. 1 is a perspective view of a display device according to an embodiment of the present invention, FIG. 2 is a side view illustrating operation examples of the display device according to an embodiment of the present invention, and FIG. 3 is a cross-sectional view illustrating the inside of a housing in FIGS. 1 and 2.

A display device includes a housing 1, and a flexible display 2 which is lowered to the housing 1 or lifted above the housing 1. The flexible display 2 may include a display panel 3 and a display cover 4.

The display device may further include a roller 5, (see FIG. 3). When the flexible display 2 is lowered, the flexible display 2 is rolled around the roller 5. The roller 5 may be disposed in the housing 1.

The display device may include a lift assembly 10 which lifts or lowers the flexible display 2. The lift assembly 10 may be connected to the flexible display 2, and the flexible display 2 may be lifted or lowered by the lift assembly 10 in a state of being connected to the lift assembly 10.

The display device may have a thickness in a front-back direction (X), have a width in a horizontal direction (Y), and have a height in a vertical direction (Z).

The housing 1 may include a combination of a plurality of members. A space S in which the roller 5 is accommodated may be formed in the housing 1. When the flexible display 2 is lowered, the flexible display 2 may be accommodated in the space S together with the rollers 5. When the flexible display 2 is lifted, at least a part of the flexible display 2 may be lifted above the space S. Only a part or all of the flexible display 2 may be lifted above the space S according to the lifted height.

The roller 5 may be rotatably accommodated in the interior of the housing 1. The housing 1 may be provided with a roller supporter 51 (see FIGS. 4 to 6) which rotatably supports the roller 5. A pair of roller supporters 51 may be provided in the housing 1, and the roller 5 may be rotatably supported to the pair of roller supporters 51 between the pair of roller supporters 51. The roller 5 may include a rotational shaft 52 (see FIG. 3) rotatably supported to the roller supporter 51. The roller 5 may include a roller body 53 (see FIG. 3) around which the flexible display 2 is rolled. The roller body 53 is connected to the rotational shaft 52 and may be rotated around the rotational shaft 52.

The flexible display 2 may be connected to the roller body 53. When the roller body 53 is rotated about the rotational shaft 52, the flexible display 2 may be rolled around or unrolled from the roller body 53 in a state of being connected to the roller body 53.

The housing 1 may be provided with a roller rotation mechanism (not illustrated) which rotates the roller 5 in the forward and reverse directions. The roller rotation mechanism may include a power source such as a motor, and may be connected to the rotational shaft 52 of the roller 5 to rotate the roller 5. The roller rotation mechanism may be accommodated in the space S of the housing 1 together with the roller 5. The roller rotation mechanism may include a motor connected to the rotational shaft 52 of the roller 5. The roller rotation mechanism may include a motor having a driving shaft, a belt for transmitting the driving force of the motor to the rotational shaft 52 of the roller 5 between the driving shaft of the motor and the rotational shaft 52 of the roller 5, and a power transmission member such as a pulley or a power transmission member such as a gear or a link.

In the display device, the roller 5 may be rotated while the flexible display 2 is rolled around or unrolled from the roller 5 when the flexible display 2 is lifted or lowered, without a separate roller rotation mechanism.

The housing 1 may include a front cover 11 covering the rollers 5 in front of the rollers 5. The front cover 11 may form the front surface appearance of the housing 1.

The housing 1 may further include at least one side cover 12 which covers the roller 5 on the side of the roller 5. The side cover 12 may form the side surface appearance of the housing 1. A pair of side covers 12 may be provided, and the pair of side covers 12 may include a left cover positioned on the left side of the roller 5 and a right side cover positioned on the right side of the roller 5.

The housing 1 may be provided with an opening 13 (see FIG. 3) through which the flexible display 2 passes. The housing 1 may further include a top cover 14 which forms an upper surface appearance. The opening 13 may be formed in the top cover 14 so as to be vertically opened.

The display device may include a housing door 20 which opens and closes the opening 13. The housing door 20 may be disposed in the top cover 14 so as to extend or retract horizontally to open or close the opening 13, or may be arranged to be rotated in the vertical direction. The housing door 20 may be positioned in the opening 13 to close the opening 13 when all of the flexible display 2 is inserted into the space S of the housing 1, and the housing door 20 may open the opening 13 before at least a part of the flexible display 2 is lifted to the upper side of the housing 1.

The flexible display 2 may be rolled around the roller 5 and all of the flexible display 2 may be accommodated in the space S. At least a part of the flexible display 2 may be unrolled from the roller 5 and lifted above the space S.

The thickness of the flexible display 2 may be thinner than the thickness of the housing 1. The width of the housing 1 may be longer than the width of the flexible display 2. When the flexible display 2 is unfolded, the height (that is, the top height of the flexible display) may be higher than the height of the housing 1 (that is, the top height of the housing). When the flexible display 2 is maximally lowered, the flexible display 2 may be inserted into the space S of the housing 1 and concealed in the housing 1, and when at least a part of the flexible display 2 is lifted above the housing 1, the flexible display 2 may be exposed above the housing 1.

As illustrated in FIG. 2A, the flexible display 2 may be inserted and accommodated into the housing 1. As illustrated in FIG. 2B, only a part of the flexible display 2 may be lifted to a predetermined height H1 on the upper surface of the housing 1. As illustrated in FIG. 2C, the flexible display 2 may be lifted to the maximum lifting height H2.

The display panel 3 preferably has elasticity such as an OLED or the like that may be bent or rolled. In this case, the display panel 3 may be a flexible display panel.

The display panel 3 may display an image through its front surface. A region of the display panel 3 which is exposed to the upper side of the housing 1 may be an active region in which an image may be seen from the outside. The region of the display panel 3 positioned in the space S of the housing 1 may be an inactive area in which no image may be seen from the outside.

The display cover 4 may be disposed on the back surface of the display panel 3 and may cover the back surface of the display panel 3.

The display cover 4 may be rolled around the roller 5 together with the display panel 3. The display cover 4 may be configured to support the display panel 3. The display cover 4 may have a higher strength than the display panel 3.

The front surface of the display cover 4 may be attached to the back surface of the display panel 3. The display cover 4 may be attached to the back surface of the display panel 3 by an adhesive means such as a double-sided tape or the like and may be integrated with the display panel 3.

The display cover 4 may include a plurality of segments 41. The segment 41 may also be referred to as an apron. Each of the plurality of segments 41 may be attached to the back surface of the display panel 3. The plurality of segments 41 may support the other segments positioned on the upper side while being in contact with the adjacent other segments in the vertical direction when the flexible display 2 is lifted. When the flexible display 2 is rolled around the roller 5, the flexible display 2 may be smoothly rolled around the roller 5 together with the display panel 3 while being spread with the adjacent other segments.

An upper assembly may be coupled to an upper portion of the flexible display. The upper assembly may include a connecting bar 48. The connecting bar 48 may be disposed to be elongated on the upper portion of the display cover 4. The connecting bar 48 may be fixed to at least one of the display panel 3 and the display cover 4 by a fastening member such as a screw or an adhesive means such as an adhesive. The connecting bar 48 may be connected to the lift assembly 10, and the flexible display 2 may be lifted and lowered by the connecting bar 48 when the lift assembly 10 lifts the connecting bar 48. The upper assembly may further include an upper bracket 49.

The lift assembly 10 may be connected to the upper portion of the flexible display 2 via the upper assembly. The lift assembly 10 may lift or lower the flexible display 2. The lift assembly 10 may be disposed behind the flexible display 2 and may support the flexible display 2 at the rear of the flexible display 2. The lift assembly 10 may be covered by the flexible display 2 when viewed from the front of the flexible display 2.

The upper portion of the flexible display 2 may be connected to the lift assembly 10 and the lower portion of the flexible display 2 may be connected to the roller 5. The flexible display 2 may be rolled around the roller 5 between the upper portion connected to the lift assembly 10 and the lower portion connected to the roller 5.

The housing 1 may further include a lift assembly supporter 15 which supports the lift assembly 10. The lift assembly supporter 15 may be disposed apart from the top cover 13 and the lift assembly 10 may be mounted to the lift assembly supporter 15. A part of the lift assembly 10 may be lifted above the opening 13 or lowered below the opening 13 together with the flexible display 2 while the lift assembly 10 is mounted on the lift assembly supporter 15.

The lift assembly supporter 15 may be disposed to be accommodated in the space S of the housing 1. The lift assembly supporter 15 may include a lower plate 16 positioned below the lift assembly 10 and a front plate 17 erected from the lower plate 16, and may protect the lift assembly 10.

The housing 1 may further include a lower frame 18 on which the lift assembly supporter 15 is disposed. The lower frame 18 may be horizontally disposed to be elongated between the pair of side covers 12. The lower frame 18 may be connected to the pair of side covers 12. The lift assembly supporter 15 may be disposed on the lower frame 18 and may be supported by the lower frame 18.

The housing 1 may further include a back cover 19 which covers a portion of the lift assembly 10 accommodated in the space S of the housing 1.

The lift assembly 10 may include a pair of arms 911 and 912. The lift assembly 10 may further include an arm joint 913 connected to each of the pair of arms 911 and 912.

The pair of arms 911 and 912 may include a first arm 911 and a second arm 912. When one of the first arm 911 and the second arm 912 is rotated, the other may be connected to interlock and rotate.

Each of the first arm 911 and the second arm 912 may be rotatably connected to the arm joint 913. A driven gear 916 may be formed on the first arm 911, and a driving gear 917 may be formed on the second arm 912. The driving gear 917 is engaged with the driven gear 916 to rotate the driven gear 916.

Upon rotation of the second arm 912, the driving gear 917 may rotate the driven gear 916 in engagement with the driven gear 916. Upon rotation of the driven gear 915, the first arm 911 may be rotated about the driven gear 916.

The first arm 911 may be rotatably connected to the upper assembly. The first arm 911 may be a driven arm which lifts and lowers the upper portion of the flexible display 2 while relatively rotating with the second arm 912. The driven arm may be connected directly to the flexible display 2 and may be connected to the flexible display 2 through a separate upper bracket 49.

When the second arm 912 rotates, the first arm 911 lifts and lowers the connecting bar 48 and the flexible display 2 may be lifted and lowered.

The first arm 911 may be rotatably connected to the connecting bar 48 and may be rotatably connected to the connecting bar 48 on the upper bracket 49. The upper bracket 49 may be fastened to the connecting bar 48 with a fastening member such as a screw. The upper portion of the first arm 911 may be connected to the connecting bar 48 or the upper bracket 49 by a hinge pin.

The lower portion of the first arm 911 may be rotatably connected to the upper portion of the arm joint 913. The lower portion of the first arm 911 may be connected to the upper portion of the arm joint 913 by a hinge pin.

The driven gear 916 may be formed below the first arm 911.

The second arm 912 may be a driving arm which rotates the first arm 911. The second arm 912 may be connected to the first arm 911 to rotate the first arm 911. The second arm 912 may be rotatably connected to the lower portion of the arm joint 913. The upper portion of the second arm 912 may be connected to the lower portion of the arm joint 913 by a hinge pin. The driving gear 917 engaged with the driven gear 916 may be formed on the upper portion of the second arm 912.

The second arm 912 is coupled to the first arm 211 and is pivotably raised in response to operation of a motor 810.

The second arm 912 may be rotatably supported on the housing 1. The second arm 912 may be rotatably connected to the lift assembly supporter 15 and may be rotatably connected to the separate arm supporters 920 and 921.

The arm supporters 920 and 921 may be mounted on the lift assembly supporter 15, and may rotatably support the second arm 912 in a state of being vertically erected on the lift assembly supporter 15.

The second arm 912 may be connected to an arm shaft P (see FIG. 3), which is a rotation center shaft of the second arm 912, and the second arm 912 may be rotated around the arm shaft P. The arm shaft P may be a horizontal shaft connected to the second arm 912, and may be arranged to be elongated in the front-back direction. The arm shaft P may be fastened to the second arm 912 so as to rotate integrally with the second arm 912 when the second arm 912 rotates.

The arm shaft P may be formed separately from the second arm 912 and then coupled to the second arm 912, or may integrally protrude from the second arm 912.

The arm shaft P may be rotatably supported by the arm supporters 920 and 921. A pair of arm supporters 920 and 921 may be provided, and the arm shaft P may be rotatably supported by the pair of arm supporters 920 and 921.

One of the pair of arm supporters 920 and 921 may be a first arm supporter mounted on the lift assembly supporter 15, the other of the pair of arm supporters 920 and 921 may be a second arm supporter mounted on the first arm supporter. A space in which a part of the second arm 912 is rotatably accommodated may be formed between the pair of arm supporters 920 and 921. The first arm supporter and the second arm supporter may be fastened by a fastening member such as a screw.

The pair of arm supporters 920 and 921 may be formed with through-holes through which the arm shaft P rotatably passes, and an arm shaft supporter such as a bearing for supporting the arm shaft P may be disposed in the through-hole.

When the second arm 912 is rotated about the arm shaft P, the second arm 912 may be rotated perpendicularly or substantially perpendicularly. The arm shaft P may rotatably connect the lower portion of the second arm 912 to the arm supporters 920 and 921.

The first arm 911 and the second arm 912 may be folded or unfolded while being connected to the arm joint 913. When the second arm 912 is rotated horizontally or substantially horizontally to the housing 1, the first arm 911 is horizontally or substantially horizontally laid down like the second arm 912 in a state of being connected to the arm joint 913. On the other hand, when the second arm 912 is rotated perpendicularly or substantially perpendicularly to the housing 1, the first arm 911 is erected perpendicularly or substantially perpendicularly like the second arm 912 above the second arm 912.

The display device may further include a rotation mechanism 100 (see FIGS. 4 to 6) which is connected to the second arm 912 to rotate the second arm 912. The rotation mechanism 100 may include a driving source such as a motor, and at least one power transmission member which transmits the driving force of the driving source to the second arm 912.

The display device may further include a controller 200 which controls the rotation mechanism 100. The controller 200 may be accommodated in the space S of the housing 1 and may be protected by the housing 1. The controller 200 may include a main board having a circuit part for controlling the rotation mechanism 100. The controller 200 may control the driving source of the rotation mechanism 100. When the controller 200 drives the driving source of the rotation mechanism 100, the second arm 912 and the first arm 911 are rotated and the flexible display is lifted and lowered by the rotation of the first arm 911. The controller 200 may control the driving source of the rotation mechanism 100 according to a sensing value of an angle sensor module 1000. The controller 200 is configured to determine the vertical position of the flexible display 2 based on the detected angle sensed by an angle sensor module 1000

The display device may further include the angle sensor module 1000 connected to at least one of the arm shaft P and the second arm 912. The angle sensor module 1000 may be connected to the controller 200 through a signal line 202. The sensing value sensed by the angle sensor module 1000 may be transmitted to the controller 200 through the signal line 202.

The angle sensor module 1000 may be accommodated in the space S of the housing 1 and may be protected by the housing 1. The angle sensor module 1000 may be positioned between the arm supporters 920 and 921 and the housing 1. The angle sensor module 1000 may be positioned between the arm supporters 920 and 921 and the back cover 19. The size of the angle sensor module 1000 may be smaller than the size of each of the arm supporters 920 and 921 and the back cover 19, and may be protected by the arm supporters 920 and 921 and the back cover 19. The back cover 19 may cover the angle sensor module 1000 and may function as an angle sensor module cover.

Figure 4:
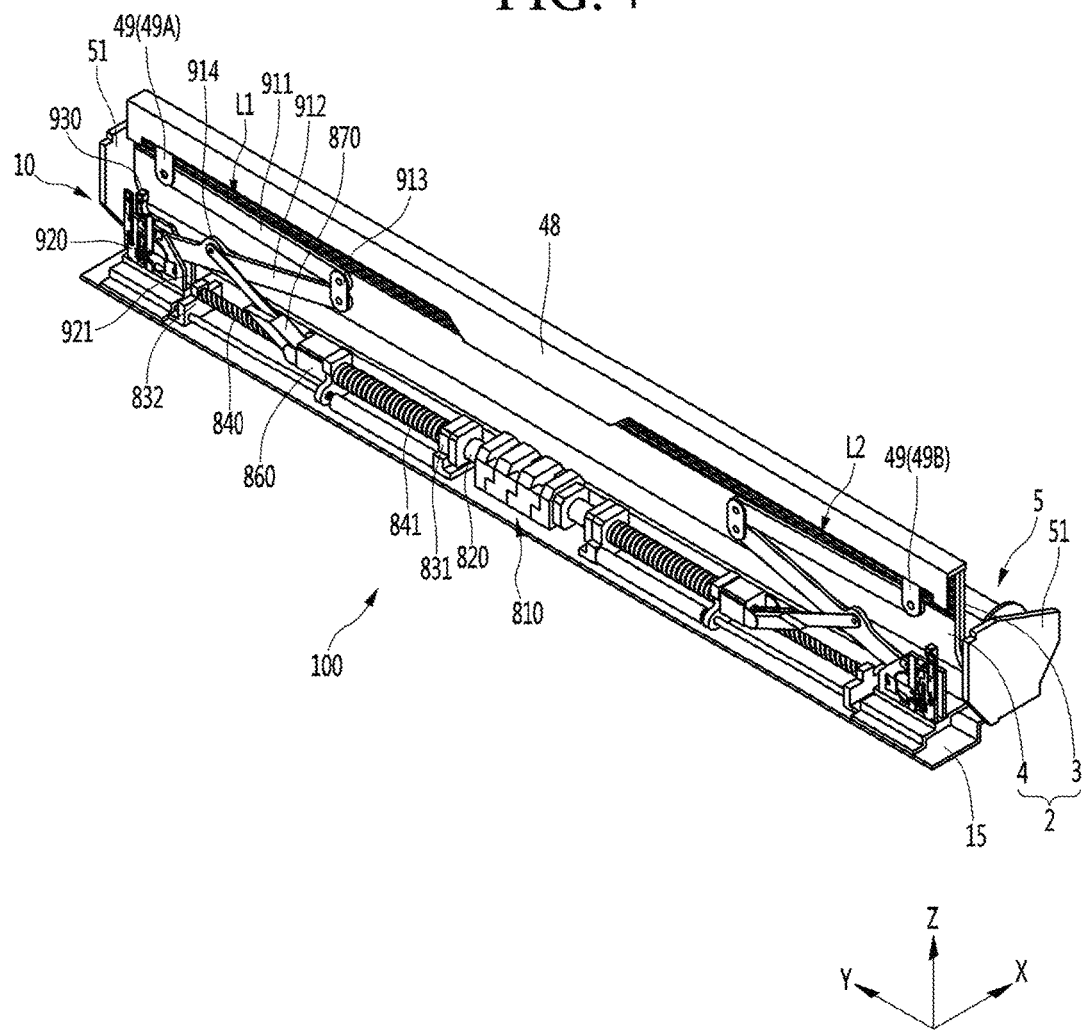
FIG. 4 is a perspective view when a lift assembly lowers a flexible display, according to an embodiment of the present invention.
Figure 5:
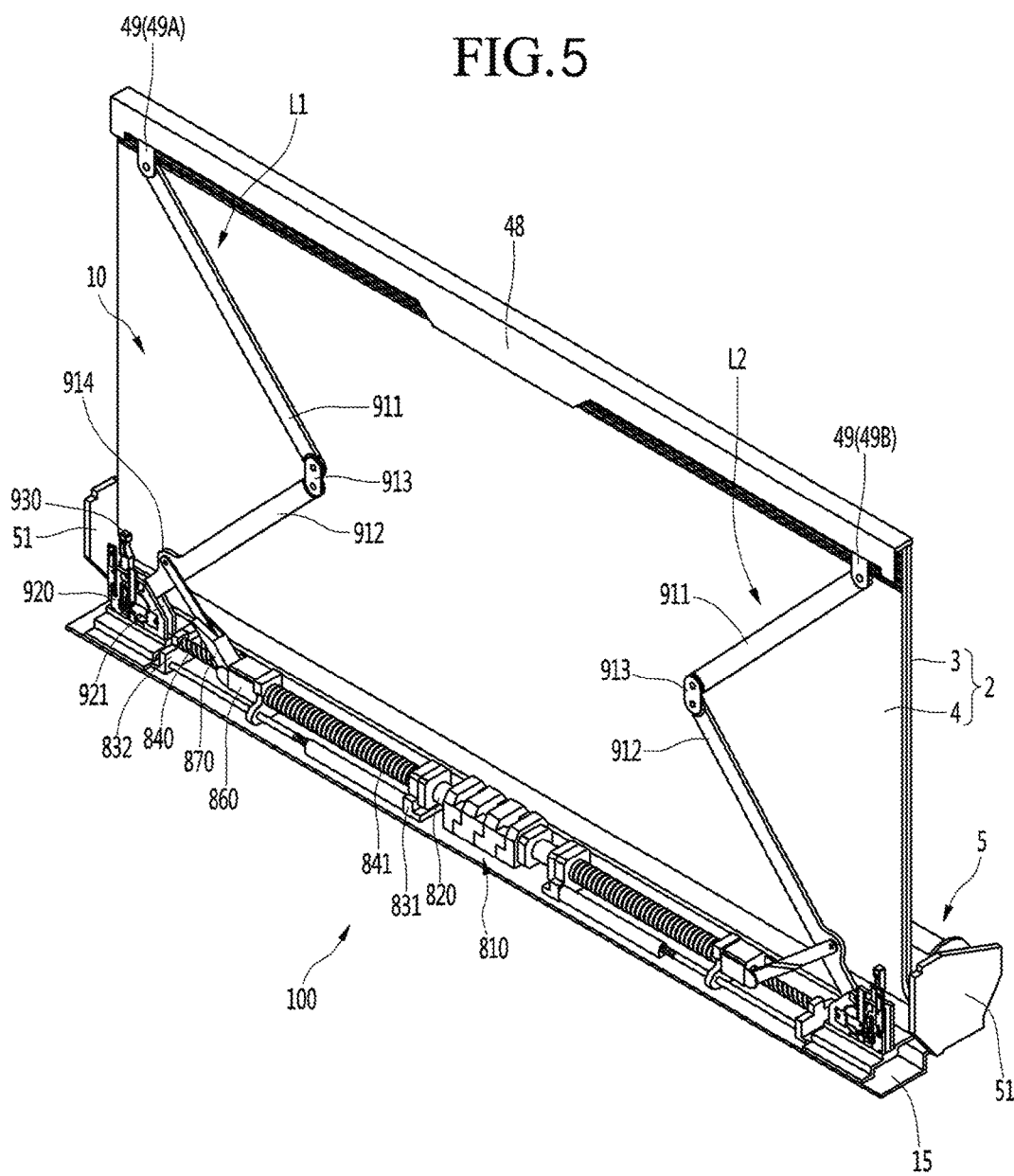
FIG. 5 is a perspective view when the lift assembly lifts the flexible display, according to an embodiment of the present invention.
Figure 6:
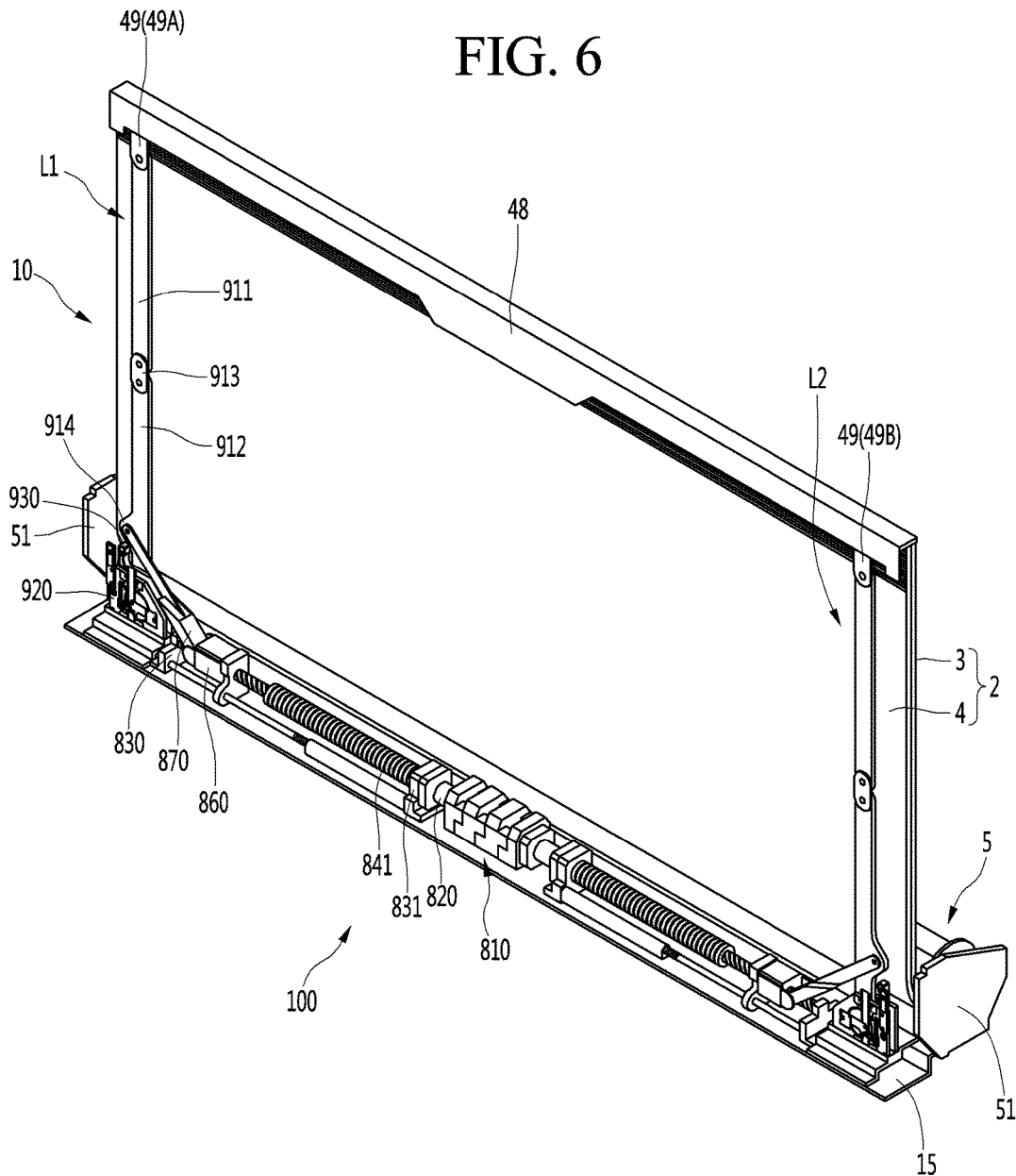
FIG. 6 is a perspective view when the lift assembly lifts the flexible display to the highest height, according to an embodiment of the present invention.
Figure 7:
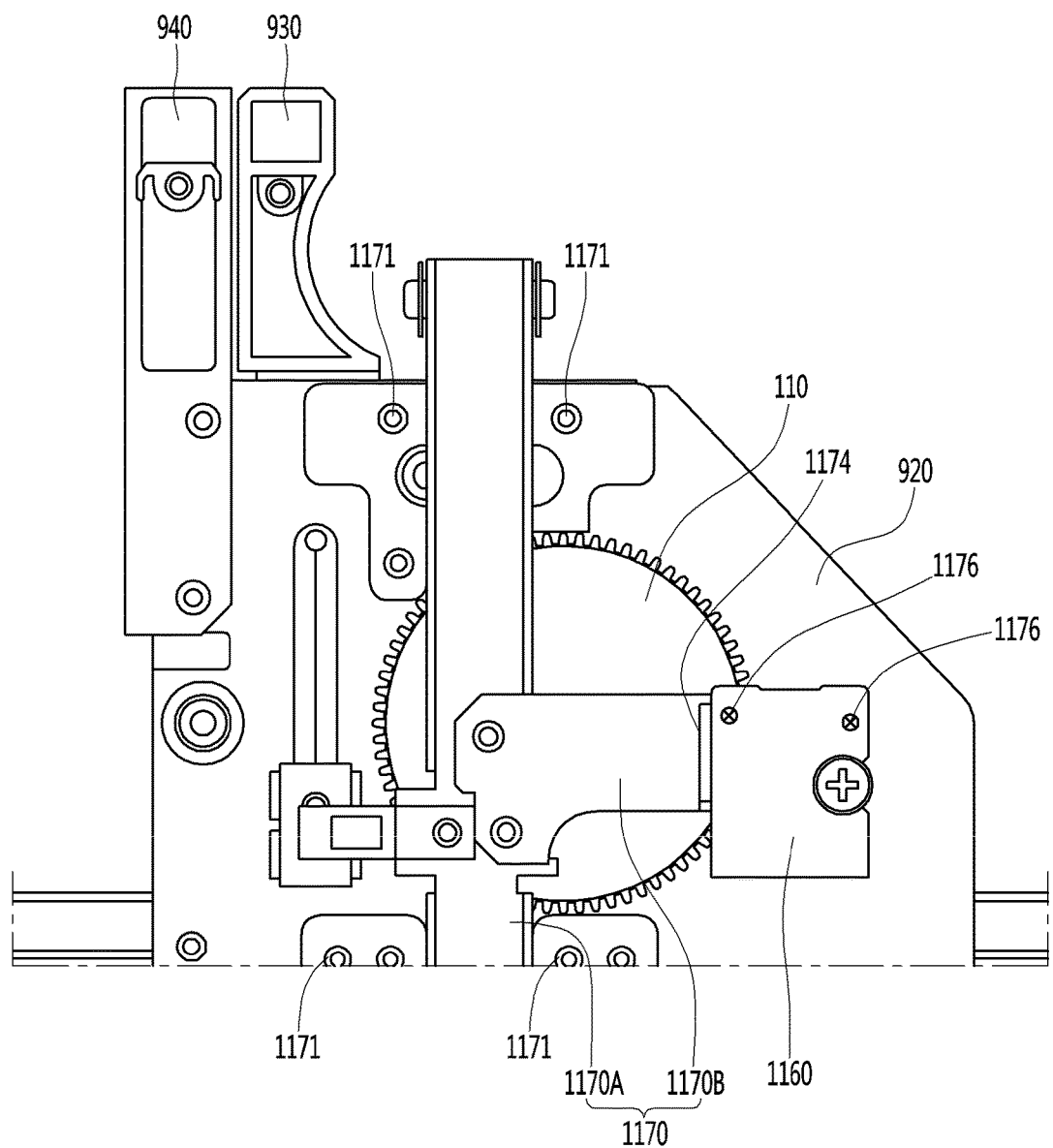
FIG. 7 is an enlarged rear view of an angle sensor module according to an embodiment of the present invention.
Figure 8:
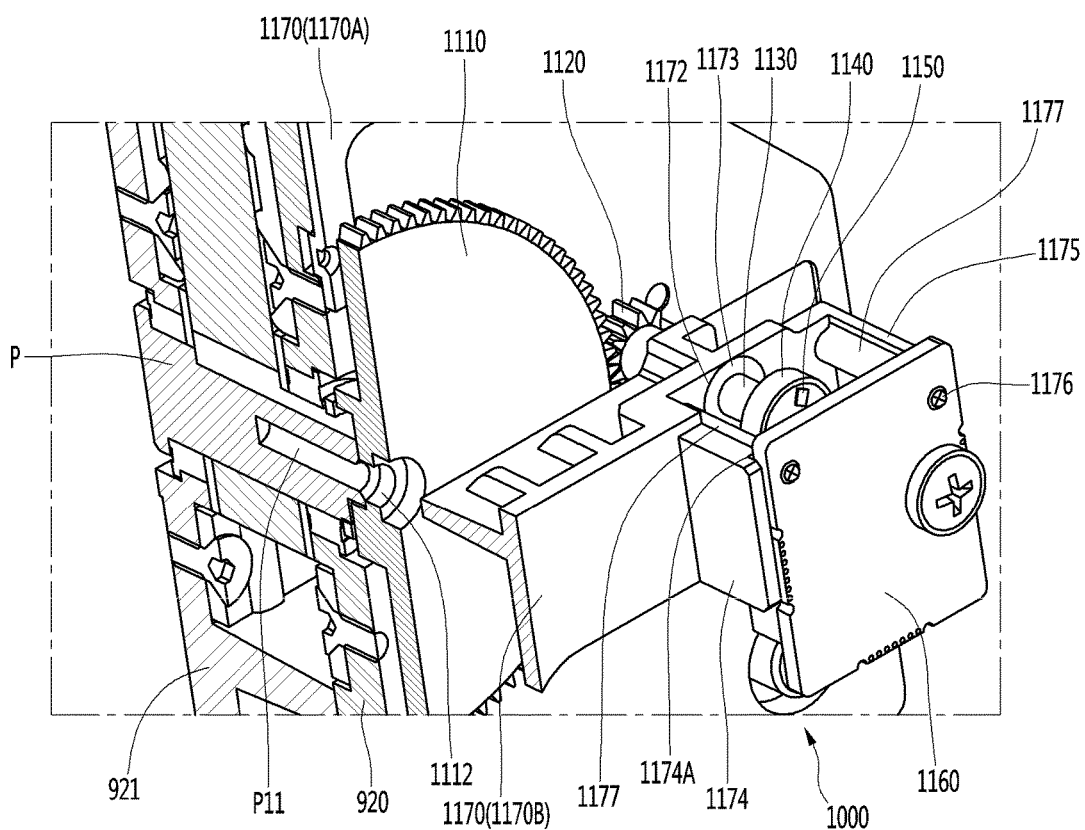
FIG. 8 is a partial cut-out perspective view of the angle sensor module according to an embodiment of the present invention.

FIG. 4 is a perspective view when the lift assembly lowers the flexible display, according to an embodiment of the present invention. FIG. 5 is a perspective view when the lift assembly lifts the flexible display, according to an embodiment of the present invention. FIG. 6 is a perspective view when the lift assembly lifts the flexible display to the highest height, according to an embodiment of the present invention. FIG. 7 is an enlarged rear view of the angle sensor module according to an embodiment of the present invention. FIG. 8 is a partial cut-out perspective view of the angle sensor module according to an embodiment of the present invention.

The display device may further include the rotation mechanism 100 which rotates the second arm 912. The first arm 911, the second arm 912, the arm joint 913, and the rotation mechanism 100 may constitute the lift assembly 10 which lifts and lowering the upper portion of the flexible display 2.

The first arm 911, the second arm 912 and the arm joint 913 may constitute a link assembly. The link assembly may interlock with the rotation mechanism 100 to lift and lower the flexible display 2.

The display device may include a plurality of link assemblies which are assemblies of the first arm 911, the second arm 912, and the arm joint 913.

The plurality of link assemblies L1 and L2 are capable of vertically lifting and lowering the flexible display 2 together in a state of being horizontally spaced apart. The rotation mechanism 100 may be connected to each of the plurality of link assemblies L1 and L2 and may operate the plurality of link assemblies L1 and L2 together.

The plurality of link assemblies L1 and L2 may include a pair of link assemblies, and the pair of link assemblies may include a left link assembly L1 and a right link assembly L2. The left link assembly L1 and the right link assembly L2 may be spaced from each other in the horizontal direction and may be symmetrically arranged in the horizontal direction.

When the display device includes both the left link assembly L1 and the right link assembly L2, the first arm 911 of the left link assembly L1 may be connected to the left upper bracket 49A mounted on the left side of the connecting bar 48 by a hinge pin, and the first arm 911 of the right link assembly L2 may be connected to the right upper bracket 49B mounted on the right side of the connecting bar 48 by a hinge pin.

The rotation mechanism 100 may be connected to the second arm 912 to rotate the second arm 912 about the arm shaft P (see FIGS. 3 and 8). The second arm 912 may be formed in a connection part 914 to which the rotation mechanism 100 is connected. The connecting part 914 may be formed between the arm shaft P and the driving gear 918 of the second arm 912.

The rotation mechanism 100 may push or pull the second arm 912 in a state of being connected to the connecting part 914, and the second arm 912 may be rotated about the arm shaft P when pushed or pulled by the rotation mechanism 100. When the rotation mechanism 100 pushes the connecting part 914, the second arm 912 may be erected while rotating about the arm shaft P clockwise or counterclockwise (for example, clockwise). On the contrary, when the rotation mechanism 100 pulls the connecting part 914, the second arm 912 may be laid down while rotating about the arm shaft P clockwise or anticlockwise (for example, counterclockwise).

The rotation mechanism 100 may include at least one motor 810, a lead screw 840 rotated by the motor 810, a slider 860 slid along the lead screw 840 during rotation of the lead screw 840, and a connecting rod 870 connected to the slider 860 and the second arm 912 to push and pull the second arm 912 when the slider 860 slides.

When the rotation mechanism 100 rotates the pair of link assemblies L1 and L2 together, the rotation mechanism 100 may include at least one motor 810, a pair of lead screws 840, a pair of sliders 860, and a pair of connecting rods 870. When the display device includes the pair of link assemblies L1 and L2, the lead screw 840, the slider 860, and the connecting rod 870 may horizontally symmetrical with respect to the motor 180.

The motor 810 may be installed in the lift assembly supporter 15. The motor 810 may be a BLDC motor.

The driving shaft of the motor 810 may be disposed on both sides of the motor 810. The right driving shaft and the left driving shaft of the motor 810 may rotate in the same direction. Alternatively, the right driving shaft and the left driving shaft of the motor assembly 810 may rotate in opposite directions.

The lead screw 840 may be connected to the driving shaft of the motor 810 by a coupling 820.

The lead screw 840 may be disposed to penetrate the slider 860. A thread may be formed on the outer periphery of the lead screw 840.

The rotation mechanism 100 may further include at least one bearing 831 and 832 which supports the lead screw 840. The bearings 831 and 832 supporting the lead screw 840 may be mounted on the lift assembly supporter 15. The lead screw 840 may be rotatably supported by the pair of bearings 831 and 832. The pair of bearings 831 and 832 may be spaced from each other in the longitudinal direction of the lead screw 840.

The slider 860 may be formed with a hollow part through which the lead screw 840 passes. The hollow part of the slider 860 may be formed with a thread engaged with the thread of the lead screw, and may be linearly moved along the lead screw 840 in the longitudinal direction of the lead screw 840 during the rotation of the lead screw 840.

The rotation mechanism 100 may further include a spring 841 which elastically supports the slider 860. The length of the spring 841 may be shorter than the length of the lead screw 840. The spring 841 may be disposed between the bearing 831 and the slider 860. The spring 840 may be disposed between the slider 860 and the bearing 831 closer to the motor 810 among the pair of bearings 831 and 832. The spring 841 may be disposed so as to surround a part of the outer periphery of the lead screw 840. One end of the spring 841 may be connected to the bearing 831, and the other end may be separated from or in contact with the slider 860.

The spring 841 may be pushed and pressed by the slider 860 when the second arm 912 is laid horizontally. When the second arm 912 starts to be erected, the spring 841 may press the slider 860 in a direction opposite to the motor 810 while being restored to an original state.

When the restoring force of the spring 841 acts on the slider 860 as described above, the initial load of the motor 810 may be reduced at the time of initial startup of the motor 810 for erecting the second arm 912.

The connecting rod 870 may be formed with a slider connection part connected to the slider 860 by a hinge pin and a second arm connection part connected to the connection part 914 of the second arm 912 by a hinge pin.

The slider connection part may be formed on one side of the connecting rod 870 in the longitudinal direction, and the second arm connection part may be formed on the other side of the connecting rod 870 in the longitudinal direction.

When the slider 860 is brought close to the motor 810, the connecting rod 870 may be pulled by the slider 860 and pull the second arm 912 downward, and the second arm 912 may be laid while rotating in a direction approaching the motor 810 with respect to the arm supporters 920 and 921.

On the other hand, when the slider 860 moves away from the motor 810, the connecting rod 870 may be pushed by the slider 860 and lift the first arm 911, and the second arm 912 may be erected while rotating in a direction away from the motor 810 with respect to the arm supporters 920 and 921.

The display device may include a sensor module which senses the height of the flexible display 2 as precisely as possible.

The flexible display 2 may perform moving control to a height set by a user or a predetermined height. When an external force is applied to the upper end of the flexible display 2 while the power is not supplied to the display device, the flexible display 2 may be stopped after being lowered by an external force, or may be stopped after being lifted.

As described above, when power is supplied to the display device in a state in which the height of the flexible display 2 is changed, the changed height of the flexible display 2 needs to be accurately sensed, and the current position (that is, height) of the flexible display 2 needs to be accurately sensed.

The driving shaft of the motor 810, the coupling 820, the lead screw 840, the slider 860, and the connecting rod 870, the second arm 912, the arm joint 913, and the first arm 911 may be a plurality of power transmission members which transmits the driving force of the motor 810 to the flexible display 2.

The display device may calculate the height of the flexible display 2 (that is, the top height of the flexible display 2) by sensing the motor 810 or the power transmission members as described above. Hereinafter, the top height of the flexible display 2 will be described as the height of the flexible display 2 for convenience.

The sensor module may sense the top height of the flexible display 2, the top height of the first arm 911, the rotation angle of the first arm 911, the height of the female joint 913, the top height of the second arm 912, the rotation angle of the second arm 912, the position of the connecting rod 970, the position of the slider 860, the rotation angle of the lead screw 840, the rotation angle of one of the rotor and the driving shaft of the motor 810.

The sensor module may transmit the sensing value to the controller 200 (see FIG. 3), and the controller 200 may calculate the current height of the flexible display 2 according to the sensing value, 100) and may control the rotation mechanism 100, in particular, the motor 810.

The sensor module may include a contact-type sensor such as a limit switch or a non-contact-type sensor such as a light sensor or a magnetic sensor. To increase accuracy and reliability, the sensor module preferably includes a non-contact-type sensor.

The sensor module is installed in the motor 810 and is capable of detecting the rotation angle of at least one of the rotor and the driving shaft of the motor 810. However, when the sensor module is installed in the motor 810, the motor 810 may be made larger. When the rotor is further rotated by inertia of the rotor, it is not easy to accurately sense the rotation angle of the rotor.

That is, the sensor module senses the height, the position, or the rotation angle of any one of the power transmission members except for the motor 810.

It is preferable that the sensor module senses the position or the rotation angle of the structure close to the upper end of the flexible display 2 as much as possible among the power transmission members.

When the height, the position or the rotation angle of the structure distal from the upper end of the flexible display 2 among the power transmission members are detected, accuracy may be low due to the assembly tolerance of the power transmission members. When the height, the position, or the rotation angle of the structure close to the upper end of the flexible display 2 is sensed, the height of the flexible display 2 may be calculated with a maximum accuracy.

That is, it is preferable that the sensor module senses the height, the position, or the rotation angle of one of the first arm 911, the arm joint 913, the second arm 912, and the arm shaft P rather than sensing the position of the slider 860 constituting the rotation mechanism 100 or the rotation angle of the lead screw 840.

On the other hand, the sensor module may be connected to the controller 200 through the signal line 202 (see FIG. 3), and it is preferable to sense the structure having constant position and height during the lifting and lowering of the flexible display 2 among the power transmission members.

When the flexible display 2 is lifted to the maximum height as illustrated in FIG. 2C, each of the first arm 911 and the arm joint 913 may be configured to be lifted above the opening 13 of the housing 1, the second arm 912 may be configured such that a portion thereof is accommodated within the housing 1, and the arm shaft P may be configured to be always accommodated in the housing 1.

It is preferable that the sensor module senses the rotation angle of the portion of the second arm 912 which is always positioned in the housing 1, or senses the rotation angle of the arm shaft P.

If the sensor module is connected to the first arm 911 or the arm joint 913, a portion of the signal line 202 connected to the sensor module may be exposed to the outside through the opening 13 of the housing 1, and the sensor module may be moved while passing through the opening 13 together with the first arm 911 or the arm joint 913.

On the other hand, when the sensor module senses the rotation angle of the portion of the second arm 912 accommodated in the housing 1 or senses the rotation angle of the arm shaft P, the signal line 202 connected to the sensor module may be always positioned in the space S of the housing 1, regardless of the height of the flexible display 2.

That is, when sensing the rotation angle of the second arm 912 or sensing the rotation angle of the arm shaft P, the sensor module may acquire a necessary sensing value in a state in which its position and height are not changed.

The sensor module may include the angle sensor module 1000 connected to at least one of the arm shaft P and the second arm 912, and may sense the rotation angle of the arm shaft P and the rotation angle of the second arm 912.

When the second arm 912 rotates, the arm shaft P may be connected to rotate integrally with the second arm 912. The rotation angle of the second arm 912 and the rotation angle of the arm shaft P are the same. The angle sensor module 1000 may be connected to one of the arm shaft P and the second arm 912.

One example of the angle sensor module 1000 may directly sense the rotation angle of the arm shaft P or the second arm 912.

Another example of the angle sensor module 1000 may increase the number of sensing values by using a pair of gears 1110 and 1120 engaged with a predetermined gear ratio (for example, 4:1 or 7.5:1).

The angle sensor module 1000 may include a main gear 1110 connected to the arm shaft P or the second arm 912, and a driven gear 1120 which is smaller than the main gear 1110 and is rotated upon rotation of the main gear 1110. The main gear 1110 rotates in response to pivoting of the second arm 912. The driven gear 1120 is engaged with the main gear 1110.

The main gear 1110 and the driven gear 1120 may be spur gears, and may be engaged with each other so as to rotate in opposite directions.

The main gear 1110 may be a large gear larger than the driven gear 1120, and the driven gear 1120 may be a small gear smaller than the main gear 1110.

The gear ratio of the main gear 1100 and the driven gear 1120 may be 4:1 or 7:5:1. Even if the main gear 1110 is rotated only by about 90° due to the structure of the link assemblies L1 and L2, the driven gear 1120 may be rotated by 360° to 675°. More sensing values may be obtained by the gear ratio of the main gear 1100 and the driven gear 1120.

That is, the angle sensor module 1000 may determine the number of sensing values according to the gear ratio of the main gear 1110 and the driven gear 1120. As the gear ratio is increased, the rotation angle of the arm shaft P or the second arm 912 may be further segmented and sensed. The rotation angle of the arm shaft P or the second arm 912 may be sensed in units of 0.1°.

When the arm shaft P is connected to the main gear 1110, the arm shaft P may include a main gear fastening part P11 fastened to the main gear 1110 by a fastening member such as a screw, and the main gear 1110 may be formed with an arm shaft fastening part 1112 fastened to the arm shaft fastening part P11 by a fastening member such as a screw. The arm shaft fastening part 1112 may be formed at the center of the main gear 1110 and may be the center of rotation of the main gear 1110.

The driven gear 1120 may be rotatably disposed around the main gear 1110.

One example of the driven gear 1120 may have a rotational shaft that is rotatably connected to the arm supporter 920.

Another example of the driven gear 1120 is not rotatably connected to the arm supporter 920, and may be connected to a shaft 1130 described later and rotated about the shaft 1130.

The angle sensor module 1000 may include a first sensor configured to detect an angle of the second arm 912 based on a rotation of the driven gear 1120. The detected angle of the second arm 912 can be based on the rotation of the driven gear 1120 is used to determine a vertical position of the upper assembly.

The first sensor may include a magnetic sensor which detects the rotation angle of the driven gear 1120 and may include a magnet 1150 which constitutes the magnetic sensor. Even if the height of the flexible display 2 changes while the power is not supplied, the angle sensor module 1000 including the magnet 1150 may detect the current position of the magnet 1150 after power is supplied.

The magnet 1150 may be mounted on the driven gear 1120. In this case, the angle sensor module 1000 may further include a magnet encoder 1160 disposed around the driven gear 1120 to sense the magnet 1150. When the magnet 1150 is mounted on the driven gear 1120, the magnet 1150 may be mounted on one surface of both surfaces of the driven gear 1120 facing the magnet encoder 1160.

On the other hand, the angle sensor module 1000 may include a shaft 1130 connected to the driven gear 1120, a magnet mounter 1140 mounted on the shaft 1130, a magnet 1150 mounted on the magnet mounter 1140, and a magnet encoder 1160 which senses the magnet 1150.

When the angle sensor module 1000 includes the shaft 1130, the driven gear 1120 may be rotated together with the main gear 1110 in a state of being connected to the shaft 1130. Upon rotation of the main gear 1110, the driven gear 1120 and the shaft 1130 may be rotated together.

The shaft 1130 may be the center shaft of the driven gear 1120 which rotatably supports the driven gear 1120. The shaft 1130 may be a connector which connects the driven gear 1120 to the magnet mounter 1140.

The magnet mounter 1140 may be rotated integrally with the shaft 1130 when the shaft 1130 rotates. The size of the magnet mounter 1140 may be larger than the size of the shaft 1130. The magnet mounter 1140 may have an extended shape on one side of the shaft 1130. The area of the surface on which the magnet 1150 is disposed among both surfaces of the magnet mounter 1140 may be larger than the cross-sectional area of the shaft 1130.

The magnet 1150 may be eccentrically mounted on the magnet mounter 1140. The magnet 1150 may be disposed between the rotation center of the magnet mounter 1140 and the outer periphery of the magnet mounter 1140.

The magnet encoder 1160 may output the sensing value according to the position of the magnet 1150. When the shaft 1130 rotates, the magnet 1150 may be rotated about the rotational center axis of the shaft 1130. The magnet encode 1160 may sense the angle at which the magnet 1160 is rotated by sensing the position of the magnet 1160. The magnet encoder 1160 may be connected to the controller 200 through the signal line 202 and may transmit the sensing value to the controller 200.

The angle sensor module 1000 may further include a sensor bracket 1170.

The sensor bracket 1170 may be mounted on the arm supporter 920 and 921 or the lift assembly supporter 15. The sensor bracket 1170 may include a fastening part 1171 fastened to the arm supporters 920 and 921 by a fastening member such as a screw.

The sensor bracket 1170 may rotatably support the shaft 1130. The sensor bracket 1170 may be formed with a through-hole 1172 through which the shaft 1130 passes. The sensor bracket 1170 may further include a shaft supporter 1173, such as a bearing, disposed between the shaft 1130 and the through-hole 1174.

The sensor bracket 1170 may further include a pair of sidewalls 1174 and 1175 protruding in a backward direction.

The magnet encoder 1160 may be seated on a magnet encoder seating jaw 1174A formed at the rear end of at least one of the pair of sidewalls 1174 and 1175 and fastened to the sensor bracket 1170 by a fastening member 1176 such as a screw.

The magnet mounter 1140 and the magnet 1150 may be positioned between the pair of sidewalls 1174 and 1175. The pair of sidewalls 1174 and 1175 may cover the magnet 1140 and the magnet code 1160 and may protect the magnet 1150.

The sensor bracket 1170 may be formed with a magnet encoder fastening part 1177 in which the magnet encoder 1160 is fastened by the fastening member 1176 such as a screw. The magnet encoder fastening part 1177 may be formed to protrude from the pair of sidewalls 1174 and 1175.

The sensor bracket 1170 may include a combination of a plurality of brackets. In this case, the sensor bracket 1170 may include a first bracket 1170A which is long in the vertical direction and a second bracket 1170B which is fastened to the first bracket 1170A and is long in the horizontal direction.

A part of the first bracket 1170A may be positioned behind the main gear 1110, and the first bracket 1170A may protect the main gear 1110. The fastening part 1171 may be formed on the first bracket 1170A.

A part of the second bracket 1170B may be positioned behind the main gear 1110, and the second bracket 1170B may protect the main gear 1110. The through-hole 1172, the pair of sidewalls 1174 and 1175, and the magnet encoder fastening part 1177 may be formed on the second bracket 1170B.

Figure 9:
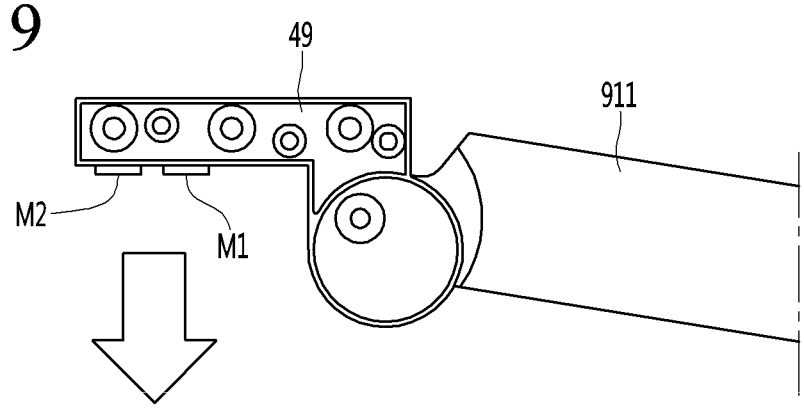
FIG. 9 is a rear view illustrating an upper bracket, an biasing member, and a stationary member when the upper bracket is lowered, according to the embodiment of the present invention.
Figure 9:
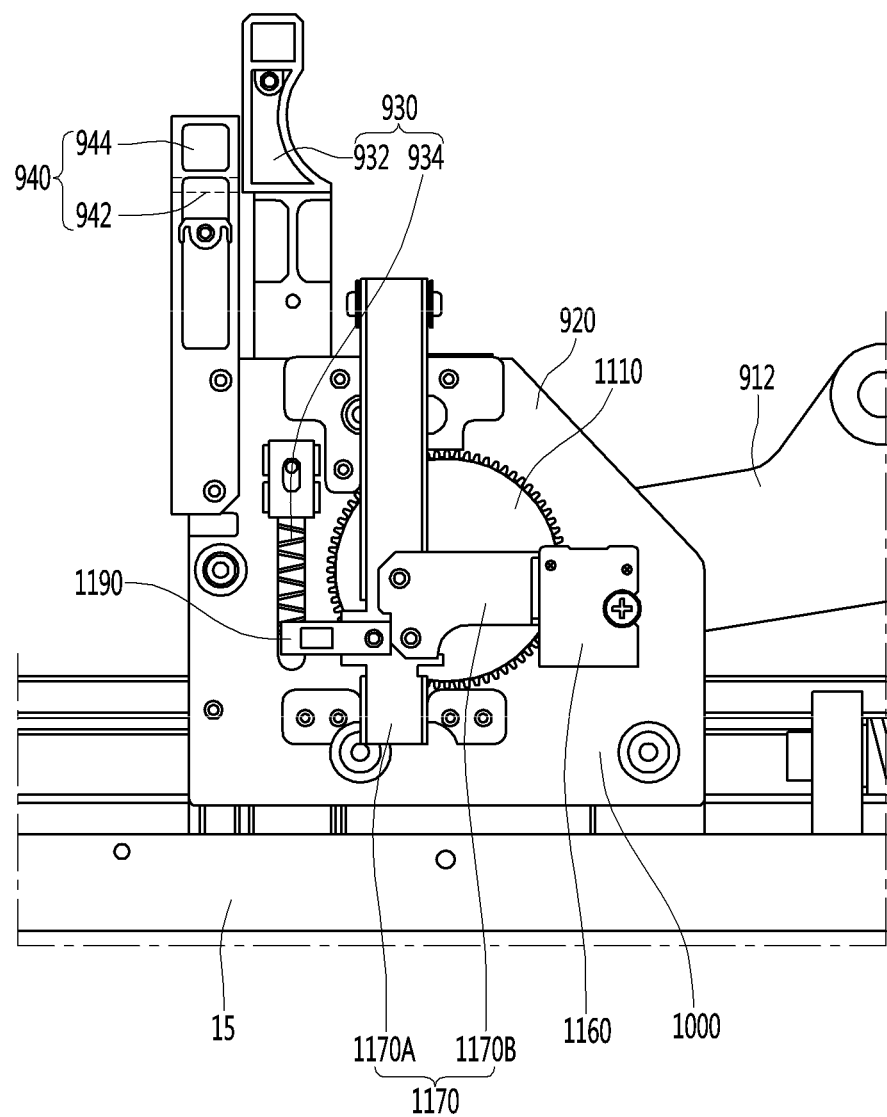
Figure 10:
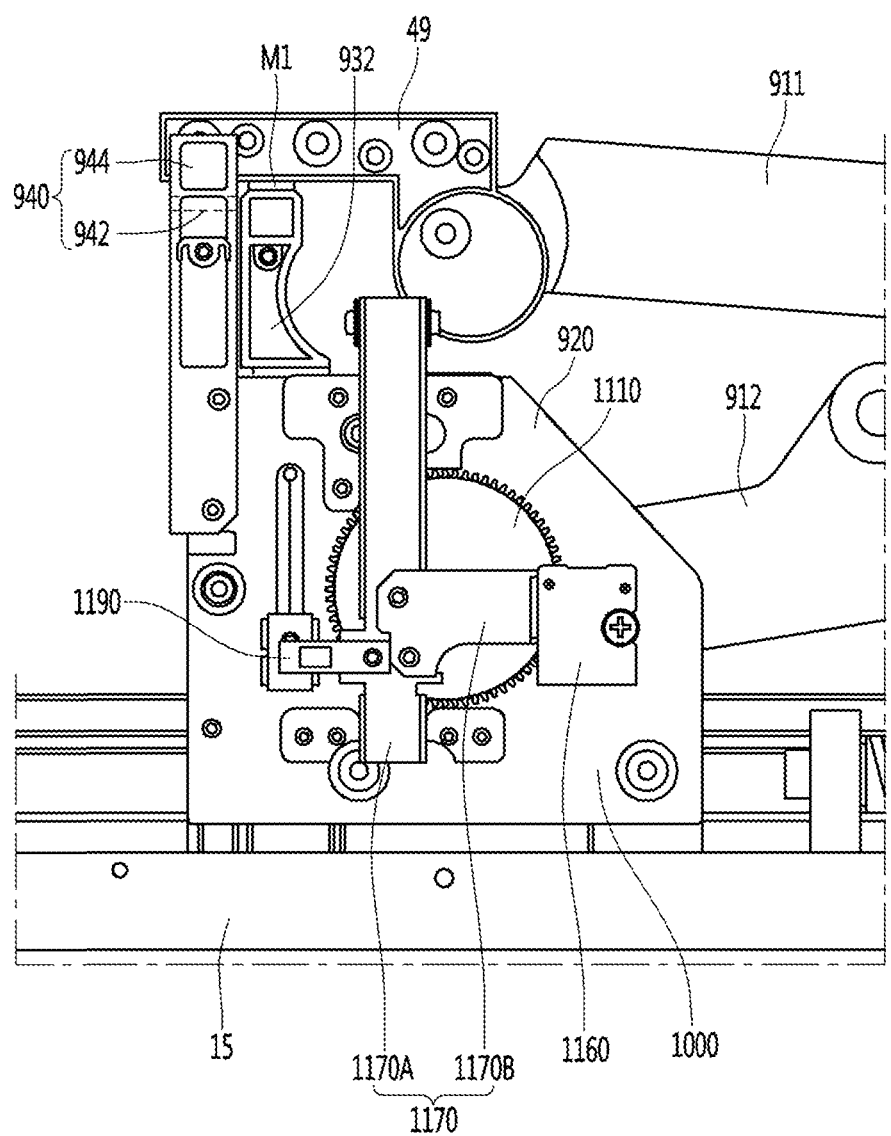
FIG. 10 is a rear view illustrating the upper bracket, the biasing member, and the stationary member when the upper bracket is completely lowered, according to the embodiment of the present invention.

FIG. 9 is a rear view illustrating an upper bracket, an biasing member, and a stationary member when the upper bracket is lowered, according to the embodiment of the present invention. FIG. 10 is a rear view illustrating the upper bracket, the biasing member, and the stationary member when the upper bracket is completely lowered, according to the embodiment of the present invention. The lift assembly 10 further comprises a biasing member to apply a biasing force to the upper assembly in a first direction for extending the flexible display 2 away from the housing 1. biasing member When the flexible display 2 is lowered, one of the connecting bar 48, the upper bracket 49, and the first arm 911 may be brought into contact with the upper surface of the biasing member 930 and seated thereon.

The biasing member 930 may elastically supports the upper assembly or the first arm 911 when the flexible display 2 is lowered.

The biasing member 930 may include a spring 932 seated on the arm supporters 920 and 921 or the lift assembly supporter 15, and a moving stopper 934 mounted on the spring 932.

Hereinafter, a case where the upper bracket 49 among the connecting bar 48, the upper bracket 49, and the first arm 911 is mounted on the biasing member 930 will be described. However, the present invention is not limited to the case where the upper bracket 49 is mounted on the biasing member 930, and the connecting bar 48 or the first arm 911 may be mounted on the biasing member 930.

The spring 932 may be disposed to be accommodated between the pair of arm supporters 920 and 921. The lower end of the spring 932 may be connected to one of the pair of arm supporters 920 and 921 and the lift assembly supporter 15, and the upper end of the spring 932 may be connected to the moving stopper 934.

When an external force is applied to the moving stopper 934 in the downward direction, the spring 932 may be compressed by the moving stopper 934 while absorbing impact applied to the moving stopper 934.

When no external force is not applied to the moving stopper 934 in the downward direction, the spring 932 lifts the moving stopper 934, and the moving stopper 934 may be in a lifted state, as illustrated in FIG. 9.

The upper surface of the moving stopper 934 may be directed to the upper bracket 49. When the upper bracket 49 is lowered, the upper bracket 49 may be mounted on the moving stopper 934.

When the upper bracket 49 is lowered, the upper bracket 49 may press the moving stopper 934 in the downward direction, and the moving stopper 934 may be lowered while compressing the spring 932. That is, the biasing member 930 may help the upper bracket 49 to be smoothly seated at the maximum lowering height while absorbing impact when the upper bracket 49 is lowered.

On the other hand, when the upper bracket 49 is seated on the moving stopper 934 to compress the spring 932 to the maximum, a repulsive force may be applied to the upper bracket 49. In this case, the upper bracket 49 may jump upward by a repulsive force exerted by the biasing member 930.

In addition, while the second arm 912 is lowered, the power supplied to the motor 810 may be shut off, and the second arm 912 may be further lowered by inertial force. Even in this case, when the spring 932 is compressed to the maximum extent, a repulsive force may be applied to the biasing member 930. The upper bracket 49 may jump upward by the repulsive force exerted by the biasing member 930.

The display device may fix the position of the upper bracket 49 by using the magnetic force of the magnet. In this case, it is possible to minimize the upward jumping of the upper bracket 49 due to the repulsive force.

The display device further comprises a first magnetic member configured to magnetically engage the biasing member with the upper assembly. The first magnetic member may be disposed at a top surface of the biasing member. The first magnetic member may be disposed at the upper assembly.

The first magnetic member comprises a magnet M1 which is disposed on at least one of the upper bracket 49 and the moving stopper 934.

When the magnet M1 is mounted on the upper bracket 49, the magnet M1 may be mounted on the lower portion of the upper bracket 49. In this case, the magnet M1 may be mounted on the surface of the upper bracket 49 facing the moving stopper 934.

On the other hand, when the magnet M1 is mounted on the biasing member 930, the magnet M1 may be mounted on the moving stopper 934.

For example, one of the upper bracket 49 and the moving stopper 934 may be a magnetic body, and the other may be a non-magnetic body. In this case, the magnet M may be mounted on the non-magnetic body. When the upper bracket 49 approaches the moving stopper 934 within a predetermined distance, an attractive force may act on the magnet M1 and the magnetic body.

As another example, both the upper bracket 49 and the moving stopper 934 may be a magnetic body, and the magnet M1 may be mounted on one of the upper bracket 49 and the moving stopper 934, or may be mounted on each of the upper bracket 49 and the moving stopper 934.

As another example, both the upper bracket 49 and the moving stopper 934 may be a non-magnetic body, and the magnet M1 may be mounted on each of the upper bracket 49 and the moving stopper 934.

When the magnet M1 is mounted on each of the upper bracket 49 and the moving stopper 934, the magnet M1 mounted on the upper bracket 49 and the magnet M1 mounted on the moving stopper 934 may be mounted in a direction in which an attractive force acts.

On the other hand, the display device may further include a stationary member 940 on which one of the connecting bar 48, the upper bracket 49, and the first arm 911 is mounted when the flexible display 2 is maximally lowered.

The stationary member 940 may be provided to determine the maximum lowering height of the flexible display 2.

The stationary member 940 may be provided to the arm supporter 920. The stationary member 940 may be disposed to be elongated in the vertical direction. The stationary member 940 may be fastened to the arm supporter 920 by a fastening member such as a screw or the like, and may integrally protrude from the arm supporter 920.

As the upper assembly is moved to a retracted position, the upper assembly contacts the biasing member and thereafter contacts the stationary member 400. The upper assembly is configured to move the biasing member in a second direction opposite the first direction as the upper assembly is moved to a retracted position.

The display further further comprises a second sensor 1190 configured to detect a position of the biasing member 930. The second sensor 1190 senses the moving stopper 934. The detected position of the biasing member 930 sensed by the second sensor 1190 is used with the detected angle of the second arm 912 to determine the vertical position of the upper assembly.

When the height of the biasing member 930 is lowered by a predetermined height, one of the connecting bar 48, the upper bracket 49, and the first arm 911 may be mounted on the stationary member 940.

It is preferable that the upper bracket 49 is seated on the stationary member 940 before the spring 932 of the biasing member 930 is maximally compressed.

Hereinafter, it is assumed that the upper bracket 49 among the connecting bar 48, the upper bracket 49, and the first arm 911 is mounted on the stationary member 940. However, the present invention is not limited to the case where the upper bracket 49 is mounted on the stationary member 940, and the connecting bar 48 or the first arm 911 may be mounted on the stationary member 940.

The stationary member 940 comprises a horizontal surface 942 configured to contact a lower surface of the upper assembly, and a vertical member 944 extending adjacent to the horizontal surface 942 to prevent lateral movement of the upper assembly.

The vertical body 944 which prevents the upper bracket 99 mounted on the horizontal surface 942 from moving in the horizontal direction. When the upper bracket 49 is mounted on the horizontal surface 942, the vertical body 944 may be positioned behind the upper bracket 49, and the vertical body 944 may prevent the upper bracket 49 from being pushed in the horizontal direction.

The lift assembly 10 further comprises a second magnetic member disposed at a stationary member 940 and configured to magnetically engage with the upper assembly when the upper assembly contacts the stationary member 940. The second magnetic member is configured to magnetically engage with the upper assembly when the upper assembly is in a retracted position. The second magnetic member may be disposed at the horizontal surface 942.

The second magnetic member may comprises a magnet M2 disposed on at least one of the upper bracket 49 and the stationary member 940.

For example, one of the upper bracket 49 and the stationary member 940 may be a magnetic body, and the other may be a non-magnetic body. The magnet M2 may be mounted on the non-magnetic body. In this case, when the upper bracket 49 approaches the stationary member 940 within a predetermined distance, an attractive force may be applied to the magnet M2 and the magnetic body.

As another example, both the upper bracket 49 and the stationary member 940 may be a magnetic body, and the magnet M2 may be mounted on one of the upper bracket 49 and the stationary member 940, or may be mounted on each of the upper bracket 49 and the stationary member 940.

As another example, both the upper bracket 49 and the stationary member 940 may be a non-magnetic body, and the magnet M2 may be mounted on each of the upper bracket 49 and the stationary member 940.

When the magnet M2 is mounted on each of the upper bracket 49 and the stationary member 940, the magnet M2 mounted on the upper bracket 49 and the magnet M2 mounted on the stationary member 940 may be mounted in a direction in which an attractive force acts.

As described above, when at least one magnet M1 and M2 is included, the controller 200 may cut off the power supplied to the motor 810 before the upper bracket 49 reaches the biasing member 930 or the stationary member 940.

In this case, the upper bracket 49 may be lowered by the inertial force and the gravity even after the power supply is cut off. the impact energy is absorbed by the biasing member 930, so that the noise and the inertial force may be reduced. The upper bracket 49 may be slowly lowered. The position of the upper bracket 49 may be fixed by the attraction of the magnets M1 and M2 at a height at which the upper bracket 49 is seated on the stationary member 940. That is, the flexible display 2 may be smoothly and reliably lowered to the maximum lowering height.

When the magnet for fixing the position of the upper bracket 49 and the moving stopper 934 is referred to as a first magnet M1 and the magnet for fixing the position of the upper bracket 49 and the stationary member 940 is referred to as a second magnet M2, the present embodiment may include both the first magnet M1 and the second magnet M2, may include only the second magnet M2 without including the first magnet M1, and may include only the first magnet M1 without including the second magnet M2.

In addition, the display device may include the biasing member 930 and the first magnet M1 without the stationary member 940, and may include the stationary member 930 and the second magnet M2 without the biasing member 930.

According to an embodiment of the present invention, the height of the flexible display may be reliably sensed, and the height of the flexible display may be controlled with higher accuracy.

In addition, the number of sensing values may be increased by the gear ratio of the main gear and the driven gear, and the rotation angle of the arm shaft and the second arm may be sensed with higher accuracy.

In addition, even when an external force is applied to the flexible display and thus the height of the flexible display is changed, the height of the flexible display may be calculated with high reliability.

Furthermore, it is possible to minimize the impact or noise which may occur when the flexible display is lowered.

Moreover, the flexible display may be reliably lowered to the maximum lowering height.

The above description is merely illustrative of the technical idea of the present invention, and various modifications and changes may be made by those skilled in the art without departing from the essential characteristics of the present invention.

Therefore, the embodiments disclosed in the present invention are not intended to limit the scope of the present invention, and the scope of the present invention is not limited by these embodiments.

The scope of protection of the present invention should be construed according to the following claims, and all technical ideas within the scope of equivalents thereof should be construed as falling within the scope of the present invention.

What is claimed is:

1. A display device comprising a flexible display, the device comprising:
   housing;
   roller disposed in the housing;
   flexible display configured to be rolled around the roller;
   an upper assembly coupled to an upper portion of the flexible display;
   a lift assembly comprising:
   a motor;
   a first arm coupled to the upper assembly;
   a second arm coupled to the first arm and configured to be pivotably raised in response to operation of the motor;
   a main gear configured to rotate in response to pivoting of the second arm;
   a driven gear engaged with the main gear; and
   a first sensor configured to detect an angle of the second arm based on a rotation of the driven gear,
   wherein the detected angle of the second arm based on the rotation of the driven gear is used to determine a vertical position of the upper assembly.

2. The display device of claim 1, wherein the lift assembly further comprises a biasing member configured to apply a biasing force to the upper assembly in a first direction for extending the flexible display away from the housing.

3. The display device of claim 2, further comprising a first magnetic member configured to magnetically engage the biasing member with the upper assembly.

4. The display device of claim 3, wherein the first magnetic member is disposed at a top surface of the biasing member.

5. The display device of claim 3, wherein the first magnetic member is disposed at the upper assembly.

6. The display device of claim 3, wherein the lift assembly further comprises a second magnetic member disposed at a stationary member and configured to magnetically engage with the upper assembly when the upper assembly contacts the stationary member.

7. The display device of claim 3, wherein the lift assembly further comprises a second magnetic member configured to magnetically engage with the upper assembly when the upper assembly is in a retracted position.

8. The display device of claim 6, wherein the stationary member comprises:
a horizontal surface configured to contact a lower surface of the upper assembly; and
a vertical member extending adjacent to the horizontal surface to prevent lateral movement of the upper assembly,
wherein the second magnetic member is disposed at the horizontal surface.

9. The display device of claim 6, wherein as the upper assembly is moved to a retracted position, the upper assembly contacts the biasing member and thereafter contacts the stationary member.

10. The display device of claim 2, wherein:
the upper assembly is configured to move the biasing member in a second direction opposite the first direction as the upper assembly is moved to a retracted position; and
the display further comprises a second sensor configured to detect a position of the biasing member, wherein the detected position of the biasing member is used with the detected angle of the second arm to determine the vertical position of the upper assembly.

11. The display device of claim 1, further comprising a controller configured to determine the vertical position based on the detected angle.

12. A lift assembly for a flexible display, the lift assembly comprising:
a motor;
a first arm coupled to an upper assembly which is coupled to an upper portion of the flexible display;
a second arm coupled to the first arm and configured to be pivotably raised in response to operation of the motor;
a main gear configured to rotate in response to pivoting of the second arm;
a driven gear engaged with the main gear; and
a first sensor configured to detect an angle of the second arm based on a rotation of the driven gear,
wherein the detected angle of the second arm based on the rotation of the driven gear is used to determine a vertical position of the upper assembly.

13. The lift assembly of claim 12 further comprising a biasing member configured to apply a biasing force to the upper assembly in a first direction for extending the flexible display.

14. The lift assembly of claim 13, further comprising a first magnetic member configured to magnetically engage e biasing member with the upper assembly.

15. The lift assembly of claim 14, wherein the first magnetic member is disposed at a top surface of the biasing member.

16. The lift assembly of claim 14, further comprising a second magnetic member disposed at a stationary member and configured to magnetically engage with the upper assembly when the upper assembly contacts the stationary member.

17. The lift assembly of claim 14, further comprising a second magnetic member configured to magnetically engage with the upper assembly when the upper assembly is in a retracted position.

18. The lift assembly of claim 16, wherein the stationary member comprises:
a horizontal surface configured to contact a lower surface of the upper assembly; and
a vertical member extending adjacent to the horizontal surface to prevent lateral movement of the upper assembly,
wherein the second magnetic member is disposed at the horizontal surface.

19. The lift assembly of claim 16, wherein as the upper assembly is moved to a retracted position, the upper assembly contacts the biasing member and thereafter contacts the stationary member.

20. The lift assembly of claim 13, wherein:
the biasing member is configured to be moved by the upper assembly in a second direction opposite the first direction as the upper assembly is moved to a retracted position; and
the lift assembly further comprises a second sensor configured to detect a position of the biasing member, wherein the detected position of the biasing member is used with the detected angle of the second arm to determine the vertical position of the upper assembly.

* * * * *